United States Patent
Guo et al.

(10) Patent No.: US 11,293,115 B2
(45) Date of Patent: *Apr. 5, 2022

(54) METHOD FOR PRODUCING A SIC EPITAXIAL WAFER CONTAINING A TOTAL DENSITY OF LARGE PIT DEFECTS AND TRIANGULAR DEFECTS OF 0.01 DEFECTS/CM2 OR MORE AND 0.6 DEFECTS/CM2 OR LESS

(71) Applicant: SHOWA DENKO K.K., Tokyo (JP)

(72) Inventors: Ling Guo, Chichibu (JP); Koji Kamei, Chichibu (JP)

(73) Assignee: SHOWA DENKO K.K., Tokyo (JP)

( * ) Notice: Subject to any disclaimer, the term of this patent is extended or adjusted under 35 U.S.C. 154(b) by 4 days.

This patent is subject to a terminal disclaimer.

(21) Appl. No.: 16/325,281

(22) PCT Filed: Aug. 21, 2017

(86) PCT No.: PCT/JP2017/029740
§ 371 (c)(1),
(2) Date: Feb. 13, 2019

(87) PCT Pub. No.: WO2018/043171
PCT Pub. Date: Mar. 8, 2018

(65) Prior Publication Data
US 2019/0177876 A1    Jun. 13, 2019

(30) Foreign Application Priority Data

Aug. 31, 2016 (JP) .............................. JP2016-170194
Sep. 23, 2016 (JP) ................................. 2016-186062

(51) Int. Cl.
*C30B 25/18* (2006.01)
*C30B 29/36* (2006.01)
(Continued)

(52) U.S. Cl.
CPC ............ *C30B 29/36* (2013.01); *C23C 16/325* (2013.01); *C30B 25/20* (2013.01);
(Continued)

(58) Field of Classification Search
CPC ....... C30B 23/00; C30B 23/02; C30B 23/025; C30B 25/00; C30B 25/02; C30B 25/16;
(Continued)

(56) References Cited

U.S. PATENT DOCUMENTS

2002/0037801 A1    3/2002    Sugihara et al.
2007/0107654 A1    5/2007    Motakef et al.
(Continued)

FOREIGN PATENT DOCUMENTS

CN    102576666 A    7/2012
CN    102656297 A    9/2012
(Continued)

OTHER PUBLICATIONS

J. Hassan, et al., "Characterization of the carrot defect in 4H-SiC epitaxial layers", Journal of Crystal Growth, 2010, pp. 1828-1837, vol. 312.
(Continued)

*Primary Examiner* — Kenneth A Bratland, Jr.
(74) *Attorney, Agent, or Firm* — Sughrue Mion, PLLC

(57) ABSTRACT

A SiC epitaxial wafer in which a SiC epitaxial layer is formed on a 4H-SiC single crystal substrate having an off angle and a substrate carbon inclusion density of 0.1 to 2.5 inclusions/cm², wherein a total density of large pit defects and triangular defects caused by substrate carbon inclusions and contained in the SiC epitaxial layer is 0.6 defects/cm² or less.

6 Claims, 9 Drawing Sheets

(51) Int. Cl.
| | | |
|---|---|---|
| C30B 25/20 | (2006.01) | |
| C23C 16/32 | (2006.01) | |
| G01N 21/95 | (2006.01) | |
| G06T 7/00 | (2017.01) | |
| H01L 29/16 | (2006.01) | |
| H01L 21/02 | (2006.01) | |
| H01L 21/66 | (2006.01) | |
| H01L 29/32 | (2006.01) | |

(52) U.S. Cl.
CPC ....... *G01N 21/9505* (2013.01); *G06T 7/0004* (2013.01); *H01L 21/0262* (2013.01); *H01L 21/02378* (2013.01); *H01L 21/02529* (2013.01); *H01L 21/02634* (2013.01); *H01L 22/12* (2013.01); *H01L 29/1608* (2013.01); *H01L 29/32* (2013.01); *G06T 2207/10056* (2013.01); *G06T 2207/30148* (2013.01)

(58) Field of Classification Search
CPC ......... C30B 25/18; C30B 25/20; C30B 29/00; C30B 29/10; C30B 29/36; C23C 16/00; C23C 16/22; C23C 16/30; C23C 16/32; C23C 16/325; G01N 21/9505; G06T 7/0004; G06T 2207/10056; G06T 2207/30148; H01L 21/02378; H01L 21/02529; H01L 21/0262; H01L 21/02634; H01L 22/12; H01L 29/32; H01L 29/1608
USPC .............. 117/84–86, 88, 101, 104, 937, 951
See application file for complete search history.

(56) References Cited

U.S. PATENT DOCUMENTS

| | | | |
|---|---|---|---|
| 2010/0025696 A1* | 2/2010 | Abbondanza | H01L 21/0262 257/77 |
| 2012/0211769 A1 | 8/2012 | Kusunoki et al. | |
| 2012/0280254 A1 | 11/2012 | Muto et al. | |
| 2013/0280466 A1* | 10/2013 | Zwieback | C30B 29/36 428/64.1 |
| 2014/0145214 A1* | 5/2014 | Kageshima | H01L 21/02529 257/77 |
| 2015/0162187 A1 | 6/2015 | Miyasaka et al. | |
| 2019/0187068 A1* | 6/2019 | Guo | G01N 21/9501 |

FOREIGN PATENT DOCUMENTS

| | | |
|---|---|---|
| CN | 103649385 A | 3/2014 |
| CN | 104246023 A | 12/2014 |
| CN | 104981892 A | 10/2015 |
| CN | 109642343 A | 4/2019 |
| JP | 2010-514648 A | 5/2010 |
| JP | 2011-121847 A | 6/2011 |
| JP | 5045272 B2 | 10/2012 |
| JP | 2013-23399 A | 2/2013 |
| JP | 2014-1108 A | 1/2014 |
| JP | 2014-24703 A | 2/2014 |
| JP | 2014-122140 A | 7/2014 |
| JP | 2016-58499 A | 4/2016 |
| JP | 2018-041942 A | 3/2018 |
| WO | 2008/033994 A1 | 3/2008 |
| WO | 2016/075957 A1 | 5/2016 |

OTHER PUBLICATIONS

C. Hallin, et al., "The origin of 3C polytype inclusions in epitaxial layers of silicon carbide grown by chemical vapour deposition", Diamond and Related Materials, 1997, pp. 1297-1300, vol. 6.
International Search Report for PCT/JP2017/029740 dated Oct. 10, 2017 [PCT/ISA/210].
Sanchez et al., "Nucleation of Dislocations during Physical Vapor Transport Growth of Silicon Carbide", Materials Science Forum, vols. 338-342, Dec. 31, 2000, pp. 63-66 (5 pages total).
Office Action dated Aug. 19, 2020 from the China National Intellectual Property Administration in Application No. 201780051959.X.
Final Office Action dated Jan. 19, 2021 for U.S. Appl. No. 16/327,445.
International Search Report of related PCT/JP2017/029718 dated Nov. 21, 2017 [PCT/ISA/210].
"New Product: SiC Wafer Inspection and Review System WASAVI Series "SICA6X"", website:https://webcache.googleusercontent.com/search?q=cache:JdgKH-kyfdcJ:https://www.lasertec.co.jp/en/topics/2011/new-product-sic-wafer-inspectionreview-system-wasavi-series-sica6x.html+&cd=3&hl=zh-TW&ct=clnk&gl=tw, Nov. 11, 2011 (4 pages total).
Notice of Reasons for Rejection of related Japanese Application No. 2016-185945 dated Oct. 23, 2018.
Notification for the Opinion of Examination Intellectual Property Office Ministry of Economic Affairs of related Taiwanese Application No. 106128222 dated Aug. 3, 2018.
Office Action dated Aug. 14, 2020 in Chinese Application No. 201780052334.5.
S Leone et al., "Improved morphology for epitaxial growth on 4° off-axis 4H-SiC substrates", Journal of Crystal Growth, Apr. 5, 2009, pp. 3265-3272, vol. 311.
Office Action dated Sep. 25, 2020 in related U.S. Appl. No. 16/327,445.
D. Hofmann et al., "Analysis on defect generation during the SiC bulk growth process", Materials Science and Engineering B, 1999, pp. 48-53, vol. 61-62.
"Lasertec launches a new SiC wafer inspection and review system; WASAVI series SICA88", Lasertec Corporation, Sep. 24, 2015, retrieved from <https://lasertec.co.jp/en/topics/2015/sica88.html> on Mar. 29, 2021 (4 pages total).
Office Action dated Apr. 1, 2021 from the German Patent and Trademark Office in DE Application No. 112017004297.6.
Office Action dated Apr. 30, 2021 issued in U.S. Appl. No. 16/327,445.

* cited by examiner

METHOD FOR PRODUCING A SIC EPITAXIAL WAFER CONTAINING A TOTAL DENSITY OF LARGE PIT DEFECTS AND TRIANGULAR DEFECTS OF 0.01 DEFECTS/CM2 OR MORE AND 0.6 DEFECTS/CM2 OR LESS

CROSS REFERENCE TO RELATED APPLICATIONS

This application is a National Stage of International Application No. PCT/JP2017/029740, filed on Aug. 21, 2017, which claims priority from Japanese Patent Application No. 2016-170194, filed on Aug. 31, 2016, and Japanese Patent Application No. 2016-186062, filed on Sep. 23, 2016, the contents of which are incorporated herein by reference.

TECHNICAL FIELD

The present invention relates to a SiC epitaxial wafer and a method for producing the same, and a defect identification method.

BACKGROUND ART

Silicon carbide (SiC) is expected to be applied to power devices, high frequency devices, high temperature operation devices and the like, since it has superior properties compared to silicon (Si) such as a dielectric breakdown field that is one order of magnitude larger, a band gap that is three times larger and a thermal conductivity that is approximately three times higher.

In order to promote the practical use of SiC devices, it is essential to establish a high-quality crystal growth technique and a high-quality epitaxial growth technique.

The SiC device is generally manufactured using a SiC epitaxial wafer in which a SiC epitaxial layer (film) serving as an active region of the device has been grown by a chemical vapor deposition (CVD) method or the like, on a SiC single crystal substrate obtained by processing from a bulk single crystal of SiC grown by a sublimation recrystallization method or the like.

More specifically, the SiC epitaxial wafer is generally grown in a step-flow manner (lateral growth from an atomic step) on a SiC single crystal substrate in which a plane having an off angle in the <11-20> direction from the (0001) plane serves as a growth plane to grow a 4H—SiC epitaxial layer.

As defects in the epitaxial layer of the SiC epitaxial wafer, defects that inherit defects in the SiC single crystal substrate and defects newly formed in the epitaxial layer are known. Threading dislocations, basal plane dislocations, carrot defects, and the like are known as the former, and triangular defects and the like are known as the latter.

For example, although a carrot defect is a rod-like defect which is long in the step-flow growth direction when viewed from the epitaxial surface side, it is said to be formed by using dislocations of the substrate (threading screw dislocations (TSD) or basal plane dislocations (BPD)) or scratches on the substrate as starting points (see Non-Patent Document 1).

Further, a triangular defect is formed toward a direction in such a manner that the apex of the triangle and the opposite side (base) thereof are aligned in order from the upstream to downstream side along the step-flow growth direction (<11-20> direction). That is, the triangular defect is said to be a defect which is originated from the foreign matter (downfall) present on the SiC single crystal substrate before epitaxial growth at the time of manufacturing the SiC epitaxial wafer or within the epitaxial layer during epitaxial growth as a starting point, and which is exposed on the epitaxial surface by extending a 3C polymorphous layer along the off angle of the substrate (see Non-Patent Document 2).

CITATION LIST

Patent Documents

[Patent Document 1] Japanese Unexamined Patent Application, First Publication No. 2013-023399
[Patent Document 2] Japanese Unexamined Patent Application, First Publication No. 2016-058499

Non-Patent Documents

[Non-Patent Document 1] J. Hassan et al., Journal of Crystal Growth 312 (2010) 1828-1837
[Non-Patent Document 2] C. Hallin et al., Diamond and Related Materials 6 (1997) 1297-1300

SUMMARY OF INVENTION

Technical Problem

As described above, a triangular defect is composed of a 3C polymorph (polytype). Since the electrical properties of the 3C polymorph are different from the electrical properties of the 4H polymorph, if a triangular defect is present in a 4H—SiC epitaxial layer, that portion cannot be used as a device. In other words, triangular defects are known as killer defects.

Carbon inclusions (hereinafter sometimes referred to as "substrate carbon inclusions") are known as defects in a SiC single crystal substrate. At the time of producing a silicon carbide single crystal ingot, there are mainly Si, $Si_2C$, $SiC_2$ and the like in addition to SiC as sublimation gases from the silicon carbide raw material (powder), and in a crucible made of graphite, the surface thereof deteriorates, as the growth of the silicon carbide single crystal ingot is repeated, due to interaction between these sublimation gases and its inner wall, incorporation of these sublimation gases into the inner wall, and the like. Due to deterioration of the inner wall surface of the crucible made of graphite, graphite fine particles fly about in an internal space (hollow portion) of the crucible, which causes the generation of carbon inclusions in the silicon carbide single crystal ingot. Carbon inclusions in the SiC single crystal substrate are those carbon inclusions in the ingot that remained in the substrate even after the ingot was sliced into the SiC single crystal substrate. It has not been fully understood how the carbon inclusions in the SiC single crystal substrate affect the epitaxial layer of the SiC epitaxial wafer.

As described above, although the triangular defects caused by the downfall have been known. However, as a result of intensive research, the inventors have found triangular defects in an epitaxial layer that are caused by the carbon inclusions in the SiC single crystal substrate. Furthermore, the inventors found three types of defects (large pit defects, diagonal-line defects and bump defects) in epitaxial layers other than the triangular defects that are caused by the carbon inclusions in the SiC single crystal substrate. In other words, the inventors found that in the SiC epitaxial wafer, carbon inclusions in the SiC single crystal substrate were converted (changed) into four kinds of defect types in the epitaxial layer, and the conversion rates were further determined. Furthermore, the inventors found that large pit defects are killer defects in addition to the triangular defects caused by the carbon inclusions in the SiC single crystal substrate, and conceived the present invention. It should be noted that although ordinary pits that are generated due to dislocations of the SiC single crystal substrate have been known (see, for example, Patent Document 2), in contrast with the ordinary pits, the large pit defect caused by the substrate carbon inclusion is discovered for the first time by the inventors of the present invention.

The present invention takes the above circumstances into consideration, with an object of providing a SiC epitaxial wafer where large pit defects and triangular defects which are device killer defects caused by substrate carbon inclusions are reduced, a method for producing the same, and a defect identification method.

Solution to Problem

In order to solve the above problems, the present invention adopts the following means.

A SiC epitaxial wafer according to an aspect of the present invention is a SiC epitaxial wafer in which a SiC epitaxial layer is formed on a 4H—SiC single crystal substrate having an off angle and a substrate carbon inclusion density of 0.1 to 6.0 inclusions/cm$^2$, wherein a total density of large pit defects and triangular defects caused by substrate carbon inclusions and contained in the SiC epitaxial layer is 0.6 defects/cm$^2$ or less.

A method for producing a SiC epitaxial wafer according to an aspect of the present invention is a method for producing a SiC epitaxial wafer in which a SiC epitaxial layer is formed on a 4H—SiC single crystal substrate having an off angle and a substrate carbon inclusion density of 0.1 to 6.0 inclusions/cm$^2$, the method including an epitaxial growth step of growing an epitaxial layer on the SiC single crystal substrate, wherein in the epitaxial growth step, a growth rate is set from 5 to 100 µm/hour, a growth temperature is set to 1,500° C. or higher, and a C/Si ratio is set to 1.25 or less.

In the above method for producing a SiC epitaxial wafer, the C/Si ratio may be 1.10 or less.

In the above method for producing a SiC epitaxial wafer, a SiC epitaxial wafer having a total density of large pit defects and triangular defects of 0.6 defects/cm$^2$ or less caused by substrate carbon inclusions and contained in the SiC epitaxial layer may be selected.

A method for producing a SiC epitaxial wafer according to an aspect of the present invention is a method for producing a SiC epitaxial wafer in which a SiC epitaxial layer is formed on a 4H—SiC single crystal substrate having an off angle and a substrate carbon inclusion density of 0.1 to 6.0 inclusions/cm$^2$, the method including: a step of determining a substrate carbon inclusion density in a SiC single crystal substrate; and a step of determining densities of large pits and triangular defects caused by substrate carbon inclusions by comparing positions of substrate carbon inclusions in the SiC single crystal substrate with positions of the large pits and the triangular defects in the SiC epitaxial layer, which are measured by a confocal microscope having a confocal differential interference optical system, wherein a C/Si ratio in an epitaxial growth step of growing an epitaxial layer on the SiC single crystal substrate is selected so that a ratio of the densities of large pits and triangular defects caused by substrate carbon inclusions with respect to the substrate carbon inclusion density is ⅕ or less.

A defect identification method according to an aspect of the present invention is a method for identifying a defect in a SiC epitaxial layer in a SiC epitaxial wafer in which a SiC epitaxial layer is formed on a SiC single crystal substrate, and distinguishes a large pit defect and triangular defect caused by substrate carbon inclusions from other defects by comparing positions of the substrate carbon inclusions in the SiC single crystal substrate with positions of the large pit defect and triangular defect in the SiC epitaxial layer, which are measured by a confocal microscope having a confocal differential interference optical system.

A defect identification method according to an aspect of the present invention is a method for identifying a defect in a SiC epitaxial layer in a SiC epitaxial wafer in which a SiC epitaxial layer is formed on a SiC single crystal substrate, and identifies a defect in the SiC epitaxial layer caused by a substrate carbon inclusion in the SiC single crystal substrate and a defect in the SiC epitaxial layer caused by a downfall by using a confocal microscope having a confocal differential interference optical system and a photoluminescence device.

A defect identification method according to an aspect of the present invention is a method for identifying a defect in a SiC epitaxial layer in a SiC epitaxial wafer in which a SiC epitaxial layer is formed on a SiC single crystal substrate, and identifies a defect in the SiC epitaxial layer caused by a substrate carbon inclusion in the SiC single crystal substrate and a defect in the SiC epitaxial layer caused by a threading dislocation in the SiC single crystal substrate by using a confocal microscope having a confocal differential interference optical system and a photoluminescence device.

Advantageous Effects of Invention

According to the SiC epitaxial wafer of the present invention, it is possible to provide an epitaxial wafer where large pit defects and triangular defects caused by substrate carbon inclusions which are device killer defects are reduced.

According to the method for producing a SiC epitaxial wafer of the present invention, it is possible to provide a method for producing a SiC epitaxial wafer where a total density of large pit defects and triangular defects which are device killer defects caused by substrate carbon inclusions is reduced.

According to the method for producing a SiC epitaxial wafer of the present invention, it is possible to provide a method for producing a SiC epitaxial wafer having a ratio of the densities of large pits and triangular defects caused by substrate carbon inclusions with respect to the substrate carbon inclusion density of ⅕ or less.

According to the defect identification method of the present invention, it is possible to provide a defect identification method capable of identifying a large pit defect and triangular defect caused by substrate carbon inclusions in a SiC epitaxial layer in a SiC epitaxial wafer.

According to the defect identification method of the present invention, it is possible to provide a defect identification method capable of identifying a defect in a SiC epitaxial layer caused by a substrate carbon inclusion in a SiC single crystal substrate and a defect in a SiC epitaxial layer caused by a downfall.

According to the defect identification method of the present invention, it is possible to provide a defect identification method capable of identifying a defect in a SiC epitaxial layer caused by a substrate carbon inclusion in a SiC single crystal substrate and a defect in a SiC epitaxial layer caused by a threading dislocation in the SiC single crystal substrate.

DESCRIPTION OF EMBODIMENTS

Figure 1:
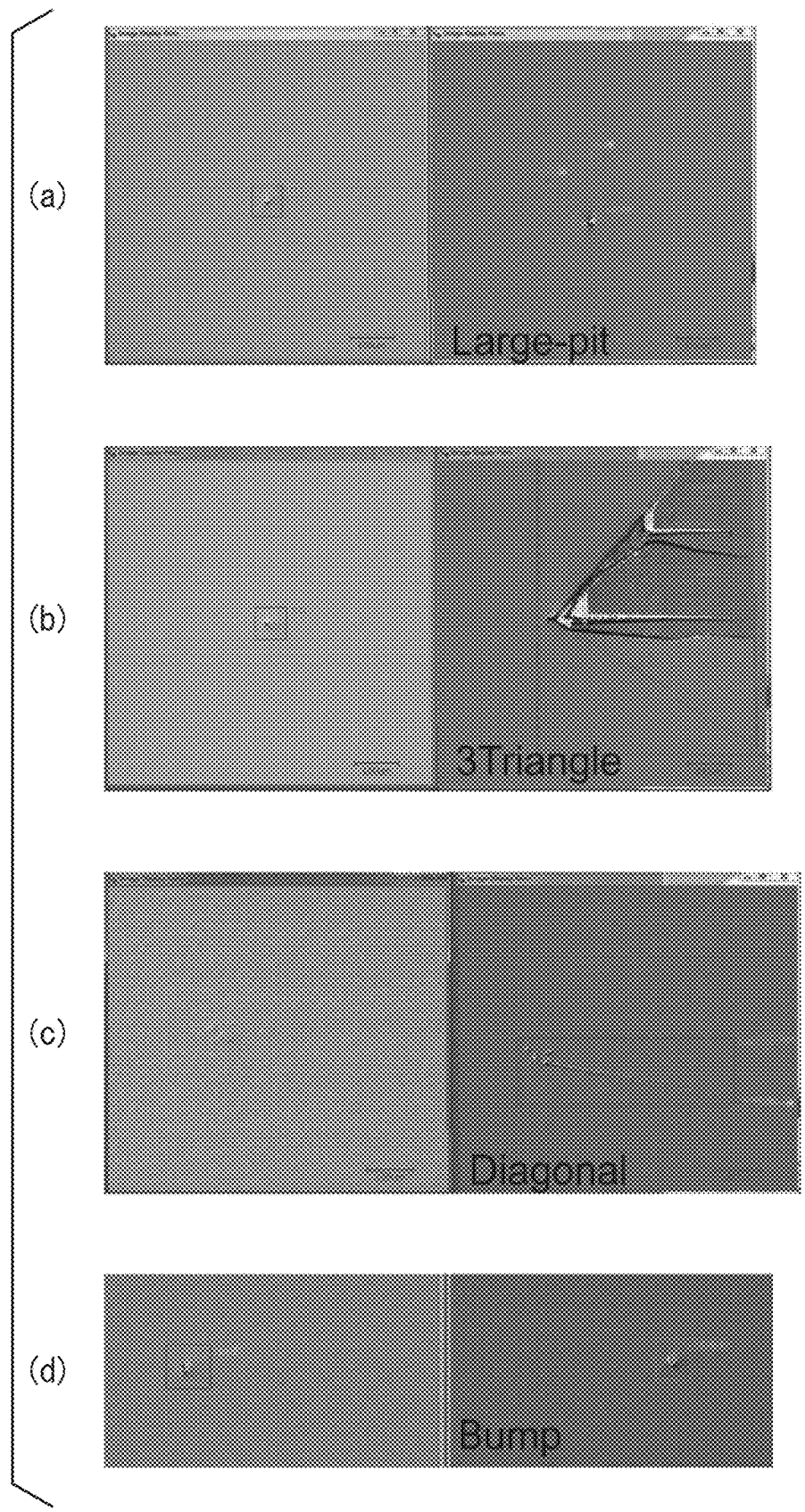
FIG. 1 shows images (in left side) of substrate carbon inclusions and images (in right side) of four types of defects caused by the substrate carbon inclusions, the images are obtained by a confocal microscope which is a surface inspection apparatus using a confocal differential interference optical system, and (a), (b), (c) and (d) are images including a large pit defect, a triangular defect, a diagonal-line defect and a bump defect, respectively.

Hereinafter, configurations of a SiC epitaxial wafer and a production method thereof to which the present invention is applied will be described with reference to the accompanying drawings. It should be noted that in the drawings used in the following description, the characteristic portions and components may be enlarged for easier understanding of characteristic features as a matter of convenience, and the dimensional ratio of each constituent element is not necessarily the same as the actual dimensional ratio. In addition, materials, dimensions, and the like exemplified in the following description are merely examples, and the present invention is not limited thereto and can be carried out with appropriate modifications within a range that achieves the effects of the present invention.

SiC Epitaxial Wafer

A SiC epitaxial wafer according to an embodiment of the present invention is a SiC epitaxial wafer in which a SiC epitaxial layer is formed on a 4H—SiC single crystal substrate having an off angle and a substrate carbon inclusion density of 0.1 to 6.0 inclusions/cm$^2$, wherein a total density of large pit defects and triangular defects caused by substrate carbon inclusions and contained in the SiC epitaxial layer is 0.6 defects/cm$^2$ or less.

The 4H—SiC single crystal substrate used for the SiC epitaxial wafer of the present invention has an off angle of, for example, 0.4° or more and 8° or less. Typical examples thereof include those with an off angle of 4°.

One of the characteristic points of the SiC epitaxial wafer according to an embodiment of the present invention is the use of a 4H—SiC single crystal substrate having a substrate carbon inclusion density of 0.1 to 6.0 inclusions/cm$^2$.

The reason why the total density of large pit defects and triangular defects caused by the substrate carbon inclusions and contained in the SiC epitaxial layer is set to 0.6 defects/cm$^2$ or less is because it was found that the triangular defects caused by the substrate carbon inclusions were device killer defects just like other triangular defects, and that the large pit defects caused by the substrate carbon inclusions were device killer defects.

That is, when a Schottky barrier diode was fabricated with a SiC epitaxial wafer containing a large pit defect and a reverse leakage current was measured by applying a reverse bias voltage thereto, a large current leakage occurred with a low reverse bias voltage. Therefore, it is found that the large pit defect is a defect which may become an ultimate killer defect of a semiconductor device. For this reason, as with triangular defects, it is important to reduce the density of large pit defects.

The inventors of the present invention have found a method for reducing the large pit defects and the triangular defects and conceived the SiC epitaxial wafer of the present invention. Hereinafter, this will be explained first.

Types of Surface Defects Caused by Substrate Carbon Inclusions

As a result of intensive studies, the inventors of the present invention have: obtained a confocal microscope image of the surface of a SiC single crystal substrate, and identified the position and the number of carbon inclusions on the substrate surface; and then formed a SiC epitaxial layer on the SiC single crystal substrate to produce a SiC epitaxial wafer, and obtained a confocal microscope image of the surface of the SiC epitaxial layer; and compared the confocal microscope image of the surface of the SiC epitaxial layer with the confocal microscope image of the substrate surface, and identified and examined what type of defects each carbon inclusion had become to appear in the SiC epitaxial layer. As a result, it was found that the carbon inclusions in the SiC single crystal substrate were substantially converted (changed) to four kinds of defect types in the SiC epitaxial layer, and the conversion rates were determined. Here, although it is difficult to identify the defect types, the present invention has great significance in specifying "at least main" defect types in the present situation where the information on the relationship between the substrate carbon inclusions and the defects caused thereby is scarce.

FIG. 1 shows images (hereinafter sometimes referred to as "SICA image") of the four types of defects obtained by a confocal microscope (SICA 6X, manufactured by Lasertec Corporation) which is a surface inspection apparatus using a confocal differential interference optical system. In each of FIGS. 1(a) to 1(d), the SICA image on the right side is a SICA image on the surface of the SiC epitaxial layer which is an image of a large pit defect, a triangular defect, a diagonal-line defect or a bump defect, respectively, in this order. In each of FIGS. 1(a) to 1(d), the SICA image on the left side is a SICA image of the substrate surface. In the SICA image on the left side, an image of a substrate carbon inclusion is observed as described later.

The SiC epitaxial wafer whose image was shown in FIG. 1 was obtained by the same production method as that of the SiC epitaxial wafer from which the data shown in FIGS. 9 to 11 to be described later were obtained, with a C/Si ratio of 1.1. The same applies to the SiC epitaxial wafers whose images are shown in the following FIGS. 2 to 8 and FIGS. 12 to 14.

The characteristics of carbon inclusions in the SiC single crystal substrate and the above-mentioned four types of defects will be described.

The carbon inclusion in the SiC single crystal substrate can be seen with a confocal microscope and is a defect which appears as a black pit in the SICA image of the substrate surface. The carbon inclusion in the SiC single crystal substrate is generated by incorporating a lump of carbon that came flying in the course of crystal formation into the ingot. Even in the same ingot, the positions change depending on the SiC single crystal substrates. As will be described later, in the carbon inclusion in the SiC single crystal substrate, since the carbon peak is strongly detected, it is possible to distinguish a defect caused by the carbon inclusion in the SiC single crystal substrate from other defects.

The large pit defect in the SiC epitaxial layer can be seen with a confocal microscope and is a defect which appears as a pit in the surface of the SiC epitaxial layer (sometimes referred to as "epitaxial surface" in the present specification). The large pit defect originates from the carbon inclusion in the substrate, extends from the carbon inclusion along the vertical direction of the off angle of the substrate, and is formed as a deep pit where the carbon inclusion in the substrate and a portion thereof are depleted. The size of the large pit defect is typically from 200 to 500 $\mu m^2$. The large pit defects as small as 100 $\mu m^2$ or less are difficult to distinguish from ordinary pits, but can be distinguished by comparison with the positions of the substrate defects. In other words, a pit at a position corresponding to the position of the carbon inclusion on the substrate surface is a large pit defect.

The triangular defect in the SiC epitaxial layer can be seen with a confocal microscope and is a defect which appears as a triangle on the epitaxial surface. The starting point is a carbon inclusion in the substrate, and a 3C polymorphous layer extends from the carbon inclusion along the vertical direction of the off angle of the substrate and is exposed on the epitaxial surface. In addition, as other triangular defects, there are triangular defects caused by particles (downfalls) in the furnace which cannot be distinguished by confocal microscope images of the SiC epitaxial layer, but can be distinguished by comparing confocal microscope images of the SiC single crystal substrate.

In other words, in the case of a triangular defect caused by a substrate carbon inclusion, the substrate carbon inclusion can be seen at the position thereof in a confocal microscope image of the SiC single crystal substrate, whereas since no downfall exists in the SiC single crystal substrate, it is not present in the confocal microscope image as long as it is prior to being introduced into the growth furnace. That is, the downfall is one which has fallen onto the SiC single crystal substrate before the growth of the SiC epitaxial layer at the time of producing the SiC epitaxial wafer, or one which has fallen onto the SiC epitaxial layer during the growth of the SiC epitaxial layer.

The diagonal-line defect in the SiC epitaxial layer can be seen with a confocal microscope and is a defect appearing as an oblique line on the epitaxial surface, which is a visible part of a stacking fault. The starting point is a carbon inclusion in the substrate, and an oblique line extends from the carbon inclusion along the vertical direction of the off angle of the substrate and is exposed on the epitaxial surface. In addition, there are diagonal-line defects caused by dislocations in the substrate, and although they cannot be distinguished by confocal microscope images of the SiC epitaxial layer, they can be distinguished by comparing confocal microscope images of the SiC single crystal substrate.

The bump defect in the SiC epitaxial layer can be seen with a confocal microscope and is an embedded defect which appears as a bump on the epitaxial surface. It is one that extends from the carbon inclusion along the vertical direction of the off angle of the substrate which is filled to a certain extent by the film formation of the SiC epitaxial layer.

More specifically, conversion rates to the four kinds of defect types caused by substrate carbon inclusions were determined as follows.

As the SiC single crystal substrate, a 6-inch 4H—SiC single crystal substrate having an off angle of 4° in the <11-20> direction with respect to the (0001) Si plane was used.

For each of the twelve 4H—SiC single crystal substrates, a known polishing step was carried out, and then a SICA image was first obtained for the polished substrate using a confocal microscope (SICA 6X, manufactured by Lasertec Corporation) to record the position information of carbon inclusions in the substrate surface. The number of carbon inclusions in each SiC single crystal substrate was from 6 to 49, and the average was about 29. That is, the substrate carbon inclusion densities were from 0.06 inclusions/$cm^2$ to 0.47 inclusions/$cm^2$, respectively, and the average was about 0.28 inclusions/$cm^2$.

Thereafter, the single crystal substrate was placed in a hot wall planetary, wafer rotation and revolution-type CVD apparatus, and a step of cleaning (etching) the substrate surface with a hydrogen gas was performed.

Subsequently, a SiC epitaxial growth step was carried out under conditions of a growth temperature of 1,600° C. and a C/Si ratio of 1.22, using silane and propane as raw material gases while supplying hydrogen as a carrier gas, and a SiC epitaxial layer having a thickness of 9 μm was formed on a SiC single crystal substrate to obtain a SiC epitaxial wafer.

Here, the C/Si ratio refers to an atomic ratio of C and Si.

With respect to this SiC epitaxial wafer, a SICA image was again obtained using a confocal microscope (SICA 6X, manufactured by Lasertec Corporation), and the SICA image was used for classification into the above four types of defects. The measurement range was the entire wafer excluding a 3 mm range from the outer peripheral edge. Based on the number of each classified defect, the conversion rate to each defect was calculated from the number of each defect with respect to the total number of substrate carbon inclusions.

The conversion rates to large pit defects, triangular defects, diagonal-line defects and bump defects were 24.4%, 13.6%, 4.3% and 57.6%, respectively.

The conversion rates vary depending on the production conditions of the SiC epitaxial wafer, but if the growth rate is in the range of 20 μm/hour or more and the growth temperature is in the range of 1,500° C. or more, under the production conditions having the same C/Si ratio, similar conversion rates tend to be obtained. Therefore, for example, when it is desired to set the density of large pit defects as killer defects to a predetermined density or less, a SiC single crystal substrate having a carbon inclusion density which is equal to or less than the predetermined carbon inclusion density calculated back from the conversion rate may be used.

For example, based on the conversion rates to large pit defects and triangular defects of 24.4% and 13.6%, when the substrate carbon inclusion density is from 0.06 inclusions/$cm^2$ to 0.47 inclusions/$cm^2$ as described above, the densities of large pit defects and triangular defects are from 0.015 defects/$cm^2$ to 0.115 defects/$cm^2$ and from 0.008 defects/$cm^2$ to 0.064 defects/$cm^2$, respectively.

In the case where the conversion rate to large pit defects is 24.4%, when it is desired to obtain a SiC epitaxial wafer having a density of large pit defects caused by substrate carbon inclusions of 0.5 defects/$cm^2$ or less, a SiC single crystal substrate having a substrate carbon inclusion density of not more than 2.0 inclusions/$cm^2$ may be used.

Generally speaking, when it is desired to obtain a SiC epitaxial wafer having a large pit defect density of q defects/$cm^2$ or less in the case where the conversion rate to large pit defects is p %, a SiC single crystal substrate having a substrate carbon inclusion density of not more than (100× q/p) inclusions/$cm^2$ may be used.

In the SiC epitaxial wafer of the present invention, the lower the total density of large pit defects and triangular defects caused by substrate carbon inclusions, the better. However, the lower limit thereof is exemplified by about 0.01 to 0.03 defects/$cm^2$ in accordance with the range of the substrate carbon inclusion density.

Next, the features of each defect will be described.

Figure 2:
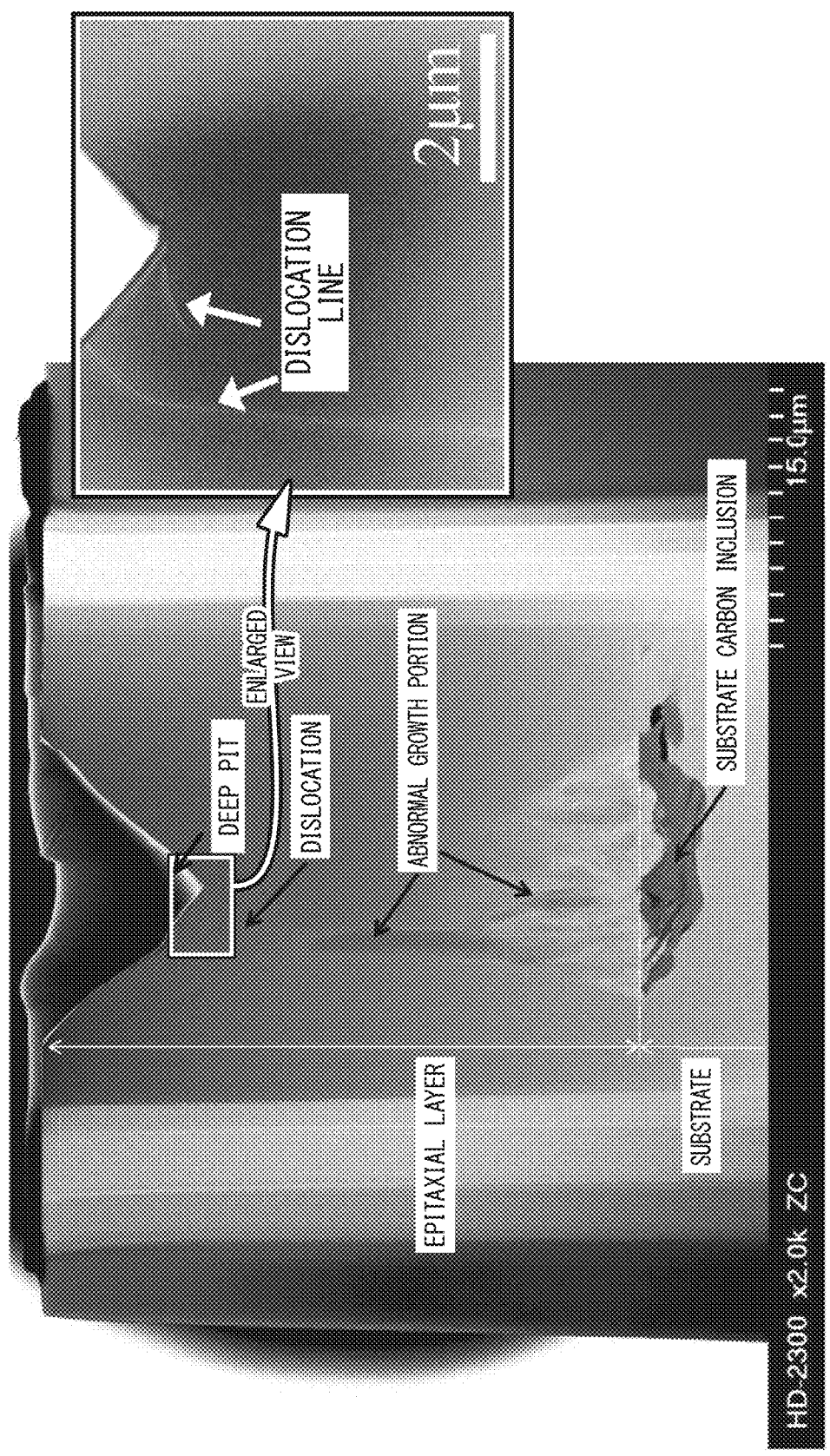
FIG. 2 is a STEM image of a cross section in the vicinity of a large pit defect caused by a substrate carbon inclusion.
Figure 3:
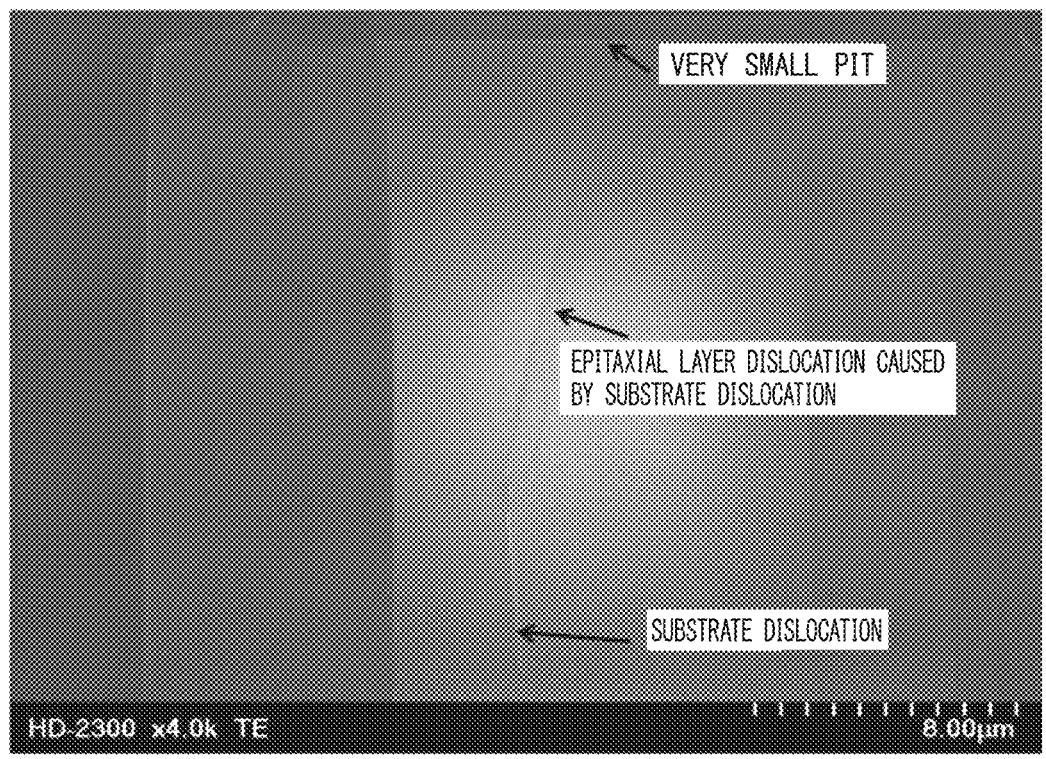
FIG. 3 is a STEM image of an ordinary pit caused by a dislocation in a single crystal substrate.

FIG. 2 shows an image (STEM image) obtained by a scanning transmission electron microscope (STEM) (HF-2200, manufactured by Hitachi High-Technologies Corporation) of a cross section in the vicinity of a large pit defect caused by a substrate carbon inclusion. As a comparison, FIG. 3 shows a STEM image of an ordinary pit caused by a dislocation in a single crystal substrate.

It should be noted that the STEM images shown in FIGS. 2 to 4 and FIG. 7 are for describing the features of each defect, and the dimensions are as shown in the figures.

Although the STEM image shown in FIG. 2 is an example, in the STEM image, a substrate carbon inclusion is visible at a lower position of the substrate. Further, a dislocation extending from the substrate carbon inclusion through an abnormal growth portion is present, and farther from the dislocation, a large pit defect ("deep pit" in FIG. 2) can be seen on the surface side. As described above, in the STEM image shown in FIG. 2, it is clearly shown that the cause of the large pit defect on the epitaxial surface is the substrate carbon inclusion. A dislocation may be present in the epitaxial layer between the substrate carbon inclusion and the large pit on the surface as shown in FIG. 2, but may not be present in some cases. Further, a deep pit is formed on the epitaxial surface to a large extent.

On the other hand, as is apparent from FIG. 3, in the STEM image of an ordinary pit caused by a dislocation in the single crystal substrate, there is no carbon inclusion in the substrate, and a set of dislocations inherited from the dislocations in the substrate to the epitaxial layer can be seen below the pit. In this case, only a very small pit is formed on the epitaxial surface.

Therefore, the large pit defect caused by the substrate carbon inclusion in the present invention is completely different from an ordinary pit caused by a dislocation in the single crystal substrate.

Figure 4:
FIG. 4 is a cross-sectional STEM image of a carbon inclusion itself in a substrate.

FIG. 4 is a cross-sectional STEM image of a foreign matter inclusion in a substrate, and the presence of foreign matter can be confirmed. The components of this foreign matter were identified by EDX (Energy Dispersive X-ray Spectroscopy).

Figures 5, 6:
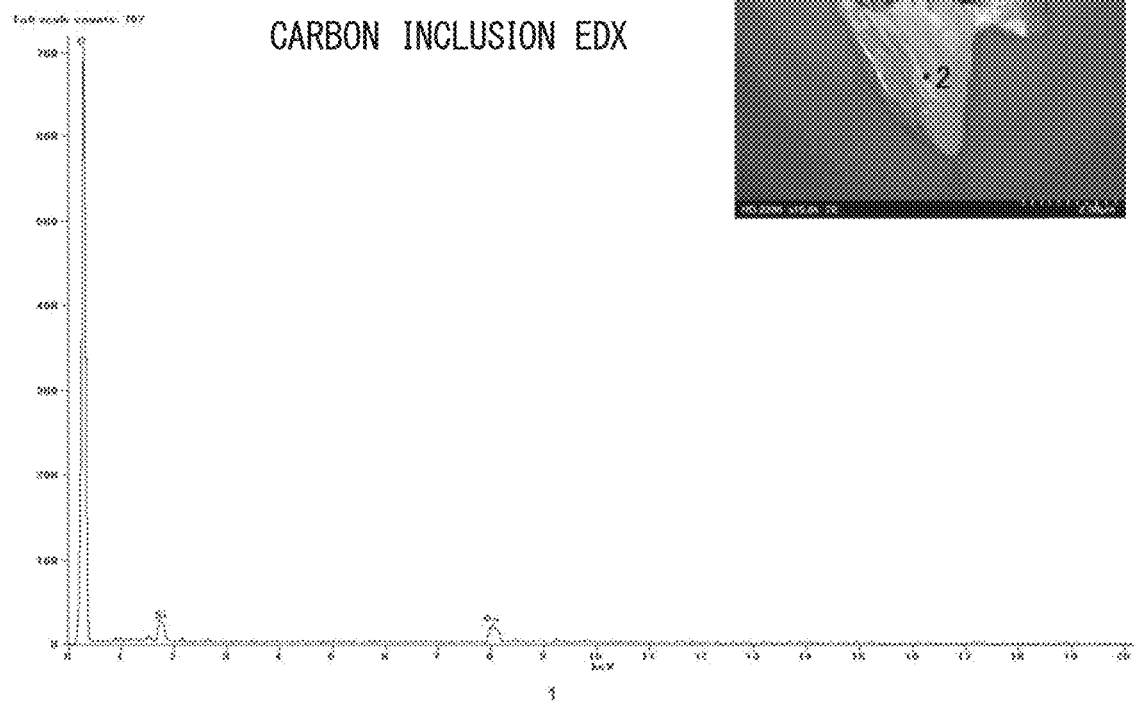
FIG. 5 shows EDX data of a carbon inclusion portion.
FIG. 6 shows EDX data of a 4H—SiC portion.

FIG. 5 shows the result of EDX for the foreign matter inclusion shown in FIG. 4. The image on the upper right is an enlargement of the vicinity of the foreign matter inclusion in the STEM image of FIG. 4, and the graph shows the result of EDX at a point portion in the foreign matter indicated by the reference numeral 2.

On the other hand, in FIG. 6, the image on the upper right is an enlargement of the vicinity of the foreign matter inclusion in the STEM image in FIG. 4, and the graph shows the result of EDX at a point portion outside the foreign matter indicated by the reference numeral 12.

The result of EDX shown in FIG. 5 confirmed that the foreign matter is carbon (substrate carbon inclusion) because the carbon peak is stronger as compared with that in FIG. 6.

Figure 7:
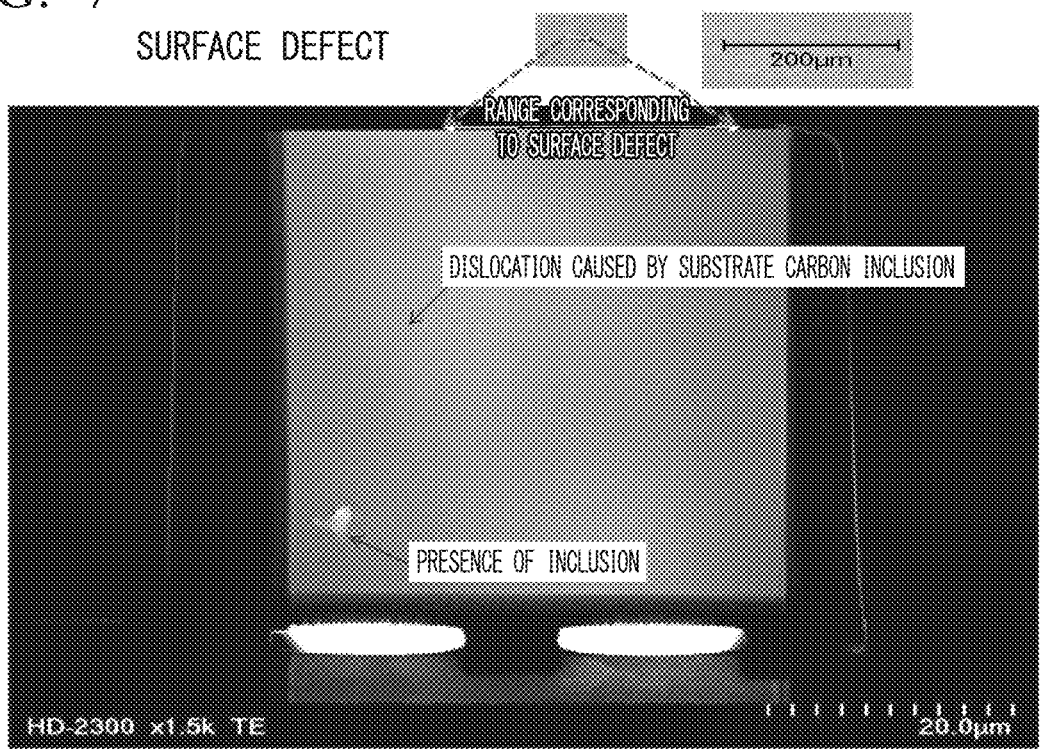
FIG. 7 shows a confocal microscope image and cross-sectional STEM image of a bump defect after formation of an epitaxial layer.

FIG. 7 is a cross-sectional STEM image of a portion where a SiC epitaxial layer is formed on a substrate carbon inclusion to become a bump defect. It is clear that a dislocation (which appears as a slightly dark straight line in the STEM image) extends from the carbon inclusion in the substrate and reaches the epitaxial surface. A confocal microscope image (the scale of the image is shown on the right side of the image) of the bump defect (surface defect) is shown in the upper part of the cross-sectional STEM image, and the correspondence with the bump defect (surface defect) of the cross-sectional STEM image is shown by dotted arrows.

A portion where the dislocation indicated by the arrow in FIG. 7 reached the epitaxial surface corresponded to the edge of the bump defect shown in the upper part of FIG. 7.

Figure 8:
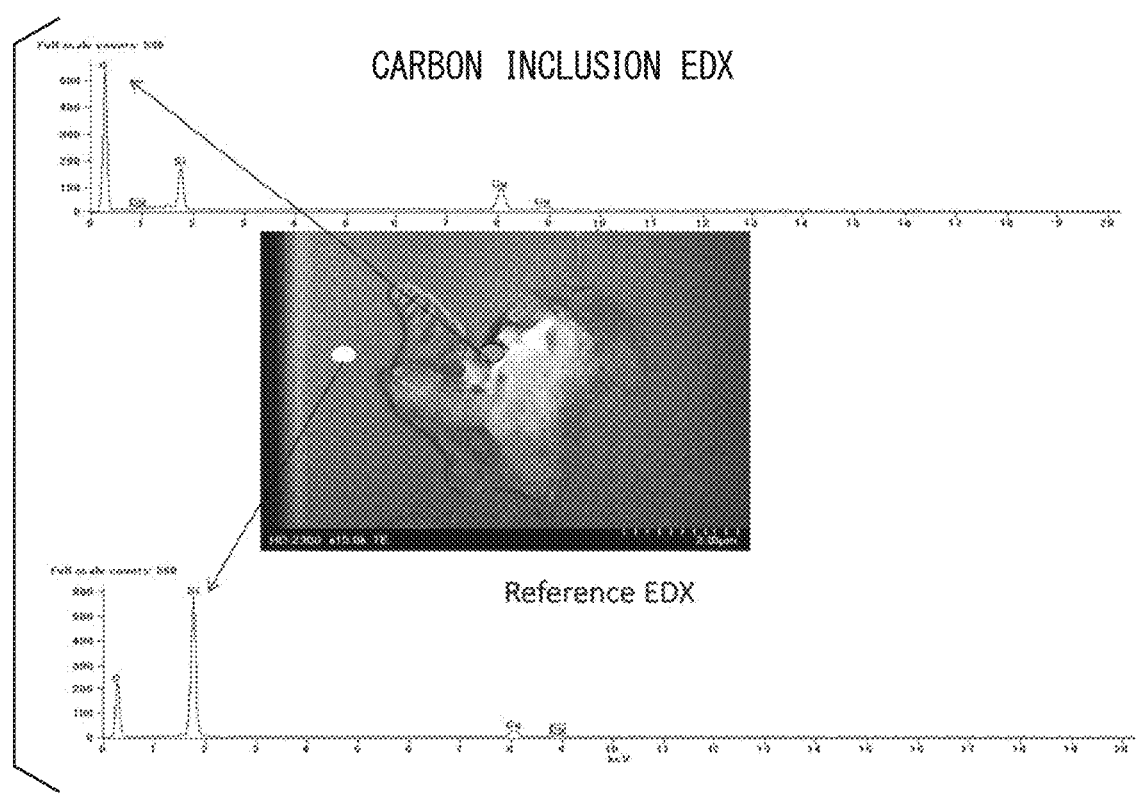
FIG. 8 shows an enlarged image and EDX data of a carbon inclusion portion converted into a bump defect in the cross-sectional STEM image shown in FIG. 7.

FIG. 8 is an enlarged image of an inclusion portion corresponding to the bump defect shown in FIG. 7 and an EDX measurement spectrum in the vicinity thereof. It was also confirmed by the EDX result shown in FIG. 8 that the foreign matter is carbon because the carbon peak is stronger in the inclusion portion (upper data) than in the portion outside the inclusion (lower data).

It is clear from FIGS. 7 and 8 that the bump defect shown in FIG. 7 is caused by the substrate carbon inclusion.

Method for Producing SiC Epitaxial Wafer (First Embodiment)

A method for producing a SiC epitaxial wafer according to a first embodiment of the present invention is a method for producing a SiC epitaxial wafer in which a SiC epitaxial layer is formed on a 4H—SiC single crystal substrate having an off angle and a substrate carbon inclusion density of 0.1 to 6.0 inclusions/$cm^2$, the method including an epitaxial growth step of growing an epitaxial layer on the SiC single crystal substrate, wherein in the epitaxial growth step, a growth rate in the thickness direction of the SiC epitaxial layer is set from 5 to 100 μm/hour, a growth temperature is set to 1,500° C. or higher, and a C/Si ratio is set to 1.25 or less.

In the method for producing a SiC epitaxial wafer of the present invention, it is a prerequisite to prepare "a 4H—SiC single crystal substrate having an off angle and a substrate carbon inclusion density of 0.1 to 6.0 inclusions/cm$^2$".

In the method for producing a SiC epitaxial wafer of the present invention, one of the features is to use a 4H—SiC single crystal substrate having a substrate carbon inclusion density of 0.1 to 6.0 inclusions/cm$^2$. It is preferably a substrate having a substrate carbon inclusion density of 0.1 to 4.5 inclusions/cm$^2$, more preferably a substrate having a substrate carbon inclusion density of 0.1 to 3.5 inclusions/cm$^2$, and still more preferably a substrate having a substrate carbon inclusion density of 0.1 to 2.5 inclusions/cm$^2$.

Figure 9:
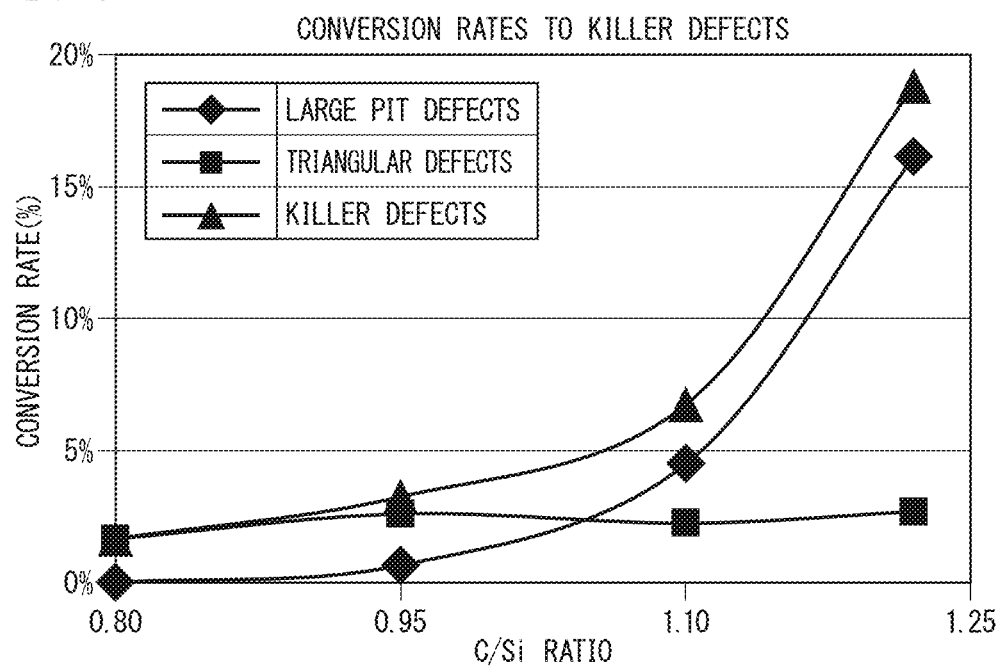
FIG. 9 is a graph showing a result of examining changes in conversion rates to large pit defects and triangular defects which are device killer defects, corresponding to C/Si ratios.
Figure 10:
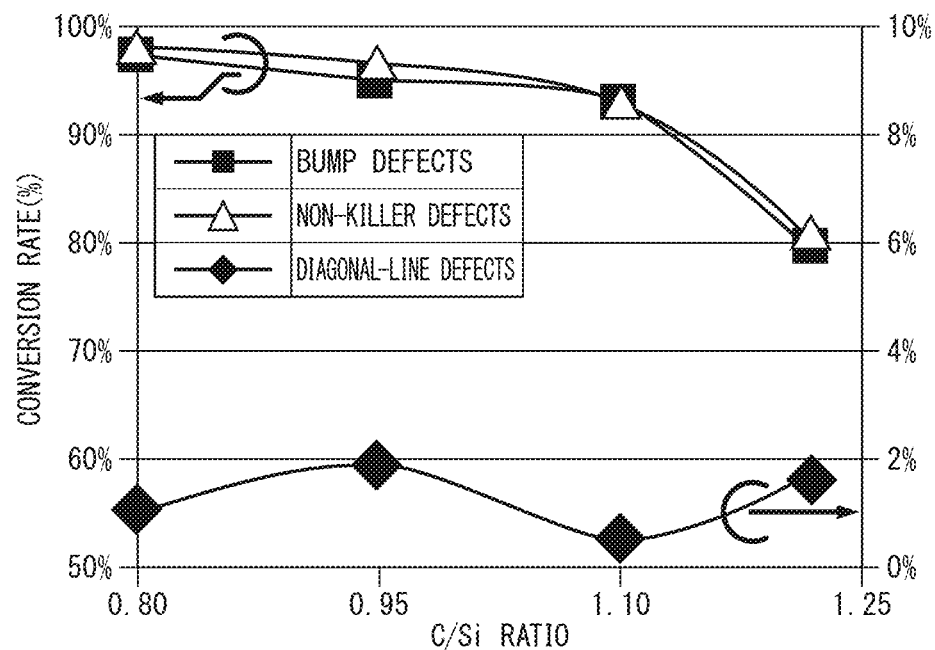
FIG. 10 is a graph showing a result of examining changes in conversion rates to bump defects and diagonal-line defects which are non-device killer defects, corresponding to C/Si ratios.
Figure 11:
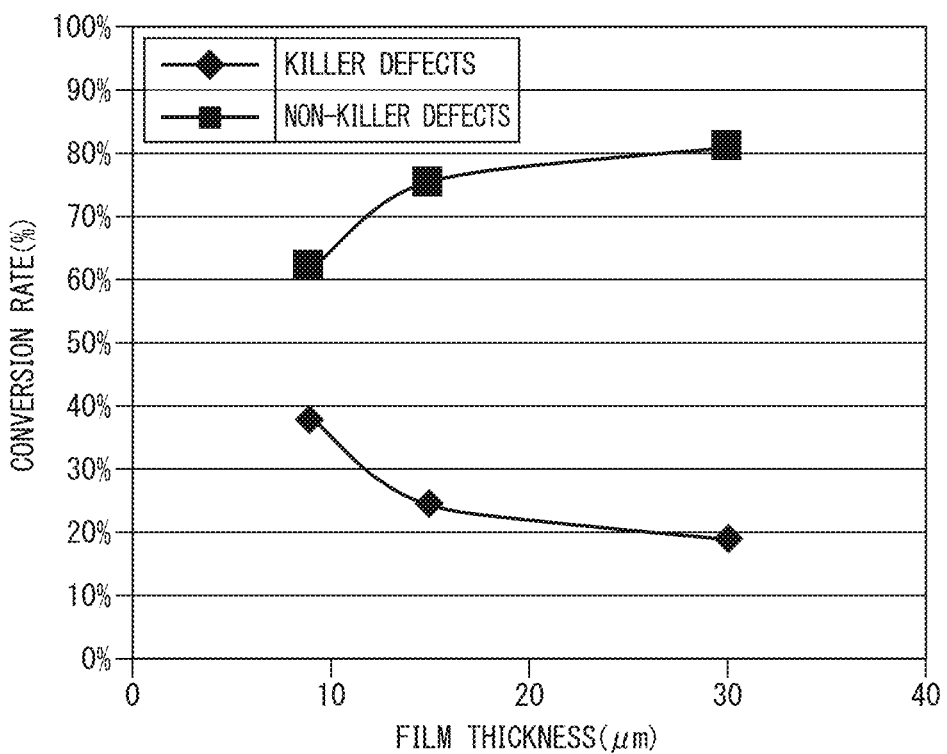
FIG. 11 is a graph showing film thickness dependence of an epitaxial film of conversion rates to device killer defects and non-device killer defects.

For the respective SiC epitaxial wafers obtained in the following manner when setting a growth temperature at 1,600° C. and changing a C/Si ratio to 0.80, 0.95, 1.10 or 1.22, FIGS. 9 and 10 show the results of examining changes in the conversion rates into the respective defect types. The SiC epitaxial wafers were obtained, using a SiC single crystal substrate having a substrate carbon inclusion density of 0.1 to 6.0 inclusions/cm$^2$ which is a 6-inch 4H—SiC single crystal substrate having an off angle of 4° in the <11-20> direction with respect to the (0001) Si plane, by carrying out a known polishing step and a step of cleaning (etching) the substrate surface, and then carrying out a SiC epitaxial growth step using silane and propane as raw material gases while supplying hydrogen as a carrier gas, thereby forming a SiC epitaxial layer having a film thickness of 30 μm on the SiC single crystal substrate. The conversion rates to the respective defect types were hardly affected by the growth temperature and growth rate in the ranges to be described later.

FIG. 9 shows the results of examining changes in conversion rates to large pit defects and triangular defects which are device killer defects, and FIG. 10 shows the results of examining changes in conversion rates to diagonal-line defects and bump defects.

As shown in FIG. 9, the conversion rate to large pit defects increased as the C/Si ratio increased. More specifically, the conversion rate to large pit defects was 0%, 0.6%, 4.5% and 16.1% at C/Si ratios of 0.80, 0.95, 1.10 and 1.22, respectively, and exceeded 5% when the C/Si ratio exceeded 1.10. Therefore, in order to suppress the conversion rate to large pit defects to 5% or less, it is necessary to suppress the C/Si ratio to 1.10 or less. It should be noted that in FIG. 9, a conversion rate obtained by combining those to large pit defects and triangular defects is shown as the conversion rate to killer defects.

Further, the conversion rate to triangular defects also tended to increase substantially as the C/Si ratio increased, although not so much as the conversion rate to large pit defects. The conversion rate to triangular defects was as low as 3% or less at any C/Si ratio. More specifically, it was 1.7%, 2.6%, 2.2% and 2.7% at C/Si ratios of 0.80, 0.95, 1.10 and 1.22, respectively.

The conversion rate to the killer defects combining the large pit defects and the triangular defects increased as the C/Si ratio increased. More specifically, the conversion rate to killer defects was 1.7%, 3.2%, 6.7% and 18.8% at C/Si ratios of 0.80, 0.95, 1.10 and 1.22, respectively, and exceeded 6% when the C/Si ratio exceeded 1.10. Therefore, in order to suppress the conversion rate to killer defects to 6% or less, it is necessary to suppress the C/Si ratio to 1.10 or less.

On the other hand, as shown in FIG. 10, the conversion rate to bump defects (Bump) decreased as the C/Si ratio increased. More specifically, the conversion rate to bump defects was 97.2%, 94.8%, 92.7% and 79.6% at C/Si ratios of 0.80, 0.95, 1.10 and 1.22, respectively, and exceeded 92% when the C/Si ratio was 1.10 or less. Therefore, in order to increase the conversion rate to bump defects to 92% or more, it is necessary to set the C/Si ratio to 1.10 or less.

Further, unlike the conversion rate to bump defects, the conversion rate to diagonal-line defects did not change greatly even when the C/Si ratio was changed. More specifically, the conversion rate to diagonal-line defects was 1.1%, 1.9%, 0.6% and 1.6% at C/Si ratios of 0.80, 0.95, 1.10 and 1.22, respectively, and showed a value as low as less than 2% at any C/Si ratio.

The conversion rate to the non-killer defects combining the bump defects and the diagonal-line defects decreased as the C/Si ratio increased. More specifically, the conversion rate to non-killer defects was 98.3%, 96.7%, 93.3% and 81.2% at C/Si ratios of 0.80, 0.95, 1.10 and 1.22, respectively, and exceeded 93% when the C/Si ratio was 1.10. Therefore, in order to increase the conversion rate to non-killer defects to 93% or more, it is necessary to set the C/Si ratio to 1.10 or less.

The relationship between the conversion rate to each defect type and the epitaxial film thickness (the thickness of the epitaxial film) was examined. The conversion rates to device killer defects and non-device killer defects are summarized in FIG. 11 by fixing the C/Si ratio at 1.22 and setting the epitaxial film thickness to 9 μm, 15 μm or 30 The conversion rate to killer defects decreased as the film thickness increased. More specifically, the conversion rate to killer defects was 38.1%, 24.5% and 18.8% at film thicknesses of 9, 15 and 30 μm, respectively, and was suppressed to 20% or less at an epitaxial film thickness of 30 μm when the C/Si ratio was 1.22. That is, the conversion rate to each defect type was found to be affected by the epitaxial film thickness as well as the C/Si ratio. In other words, the conversion rate to each defect can be controlled by two parameters of C/Si ratio and epitaxial film thickness. In general, the larger the C/Si ratio, the better the uniformity of the impurity concentration. When it is desired to increase the C/Si ratio in order to prioritize the uniformity of the impurity concentration, the conversion rate to killer defects can be suppressed by increasing the epitaxial film thickness.

In the method for producing a SiC epitaxial wafer according to an embodiment of the present invention, the C/Si ratio in the epitaxial growth step is 1.25 or less. Based on the results shown in FIG. 9, in order to reduce the conversion rates to large pit defects and triangular defects, the C/Si ratio is preferably 1.22 or less, more preferably 1.15 or less, and still more preferably 1.10 or less. In order to reduce the conversion rates to large pit defects and triangular defects, the C/Si ratio is preferably at an even lower value. When the C/Si ratio is set to 1.22 or less, the conversion rates to large pit defects and triangular defects can be reduced to 21% or less; when the C/Si ratio is set to 1.10 or less, the conversion rates to large pit defects and triangular defects can be reduced to 6.5% or less; when the C/Si ratio is set to 1.05 or less, the conversion rates to large pit defects and triangular defects can be reduced to 5.0% or less; when the C/Si ratio is set to 1.0 or less, the conversion rates to large pit defects and triangular defects can be reduced to 4.0% or less; when the C/Si ratio is set to 0.95 or less, the conversion rates to large pit defects and triangular defects can be reduced to 3.5% or less; and when the C/Si ratio is set to 0.90 or less, the conversion rates to large pit defects and triangular defects can be reduced to 2.0%.

In the method for producing a SiC epitaxial wafer according to an embodiment of the present invention, the epitaxial film thickness is not particularly limited. When the epitaxial film thickness is thinner than 10 μm, it is preferable to further reduce the C/Si ratio. When the epitaxial film thickness is greater than 15 μm, the C/Si ratio may be somewhat larger.

In the method for producing a SiC epitaxial wafer according to an embodiment of the present invention, the growth rate in the epitaxial growth step is from 5 to 100 μm/hour, although it is not particularly limited.

Since the productivity increases as the growth rate increases, the growth rate is preferably 20 μm/hour or more, more preferably 40 μm/hour or more, and still more preferably 60 μm/hour or more.

In the method for producing a SiC epitaxial wafer according to an embodiment of the present invention, the growth temperature in the epitaxial growth step is 1,500° C. or higher. Since the number of stacking faults increases when the temperature is too low and there is a problem of deterioration of the furnace member when the temperature is too high, the growth temperature is preferably 1,500° C. or higher, more preferably 1,550° C. or higher, and still more preferably 1,600° C. or higher. Further, as the upper limit, for example, about 1,750° C. can be mentioned.

In the method for producing a SiC epitaxial wafer according to an embodiment of the present invention, a step of selecting SiC epitaxial wafers having a density of large pit defects caused by substrate carbon inclusions and contained in the SiC epitaxial layer of 0.5 defects/cm$^2$ or less may be provided, prior to the epitaxial growth.

Method for Producing SiC Epitaxial Wafer (Second Embodiment)

A method for producing a SiC epitaxial wafer according to a second embodiment of the present invention is a method for producing a SiC epitaxial wafer in which a SiC epitaxial layer is formed on a 4H—SiC single crystal substrate having an off angle and a substrate carbon inclusion density of 0.1 to 6.0 inclusions/cm$^2$, the method including: a step of determining a substrate carbon inclusion density in a SiC single crystal substrate; and determining densities of large pits and triangular defects caused by substrate carbon inclusions by comparing positions of substrate carbon inclusions in the SiC single crystal substrate with positions of the large pits and the triangular defects in the SiC epitaxial layer, which are measured by a confocal microscope having a confocal differential interference optical system, wherein a C/Si ratio in an epitaxial growth step of growing an epitaxial layer on the SiC single crystal substrate is selected so that a ratio of the densities of large pits and triangular defects caused by substrate carbon inclusions with respect to the substrate carbon inclusion density is ⅕ or less.

As shown in FIG. 9, the conversion rates p % to large pit defects and triangular defects which are device killer defects change according to the C/Si ratio. Accordingly, when using a SiC single crystal substrate having a substrate carbon inclusion density of r defects/cm$^2$ or less, in a case where it is desired to set a ratio of the densities of large pits and triangular defects caused by substrate carbon inclusions with respect to the substrate carbon inclusion density to s or less, the C/Si ratio is selected so that the conversion rate p % becomes r×s×100 or less.

For example, when the substrate carbon inclusion density r is 0.28 inclusions/cm$^2$, in a case where it is desired to set the ratio s of the densities of large pits and triangular defects caused by substrate carbon inclusions with respect to the substrate carbon inclusion density to ⅕ or less, a C/Si ratio at which the conversion rate p % is 5.6% or less may be selected.

Defect Identification Method (First Embodiment)

A defect identification method according to a first embodiment of the present invention is a method for identifying a defect in a SiC epitaxial layer in a SiC epitaxial wafer in which a SiC epitaxial layer is formed on a SiC single crystal substrate, and distinguishes a large pit defect and triangular defect caused by substrate carbon inclusions from other defects by comparing positions of the substrate carbon inclusions in the SiC single crystal substrate with positions of the large pit defect and triangular defect in the SiC epitaxial layer, which are measured by a confocal microscope having a confocal differential interference optical system.

Defect Identification Method (Second Embodiment)

A defect identification method according to a second embodiment of the present invention is a method for identifying a defect in a SiC epitaxial layer in a SiC epitaxial wafer in which a SiC epitaxial layer is formed on a SiC single crystal substrate, and identifies a defect in the SiC epitaxial layer caused by a substrate carbon inclusion in the SiC single crystal substrate and a defect in a SiC epitaxial layer caused by a downfall by using a confocal microscope having a confocal differential interference optical system and a near-infrared photoluminescence device (NIR-PL).

Figure 12:
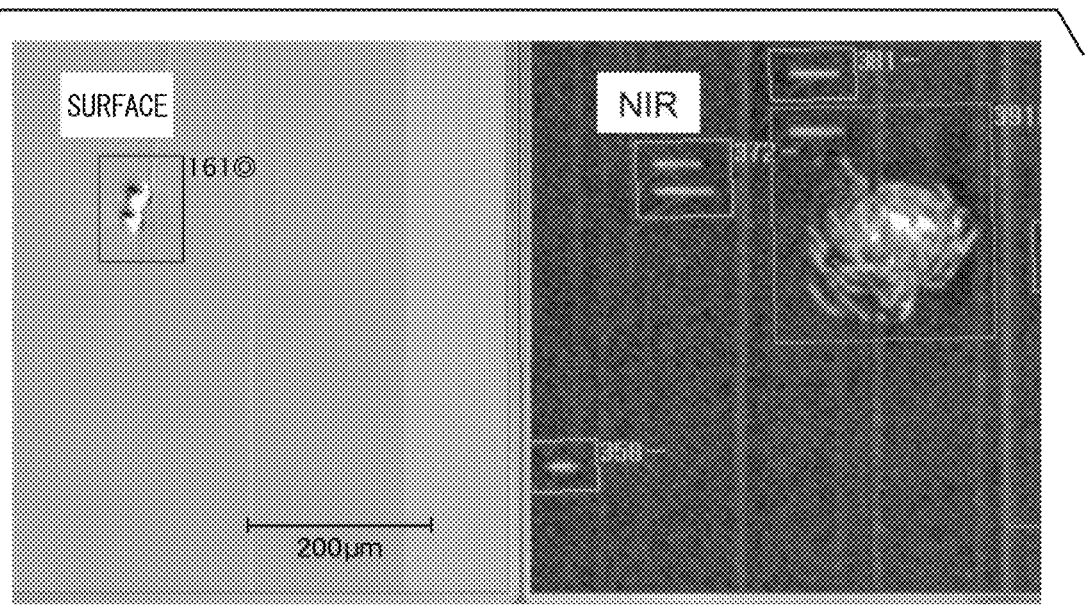
FIG. 12 shows a SICA image of the surface of a SiC epitaxial wafer in the vicinity of a large pit defect caused by a substrate carbon inclusion (left side image) and a PL image thereof (right side image).
Figure 13:
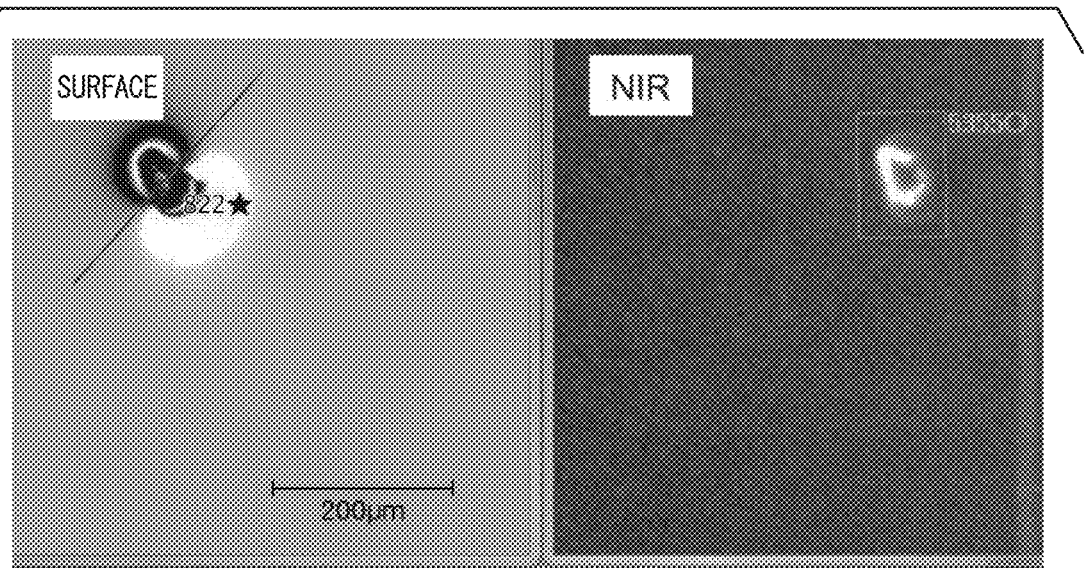
FIG. 13 shows a SICA image of the surface of a SiC epitaxial wafer in the vicinity of a pit caused by a downfall on a single crystal substrate (left side image) and a PL image thereof (right side image).
Figure 14:
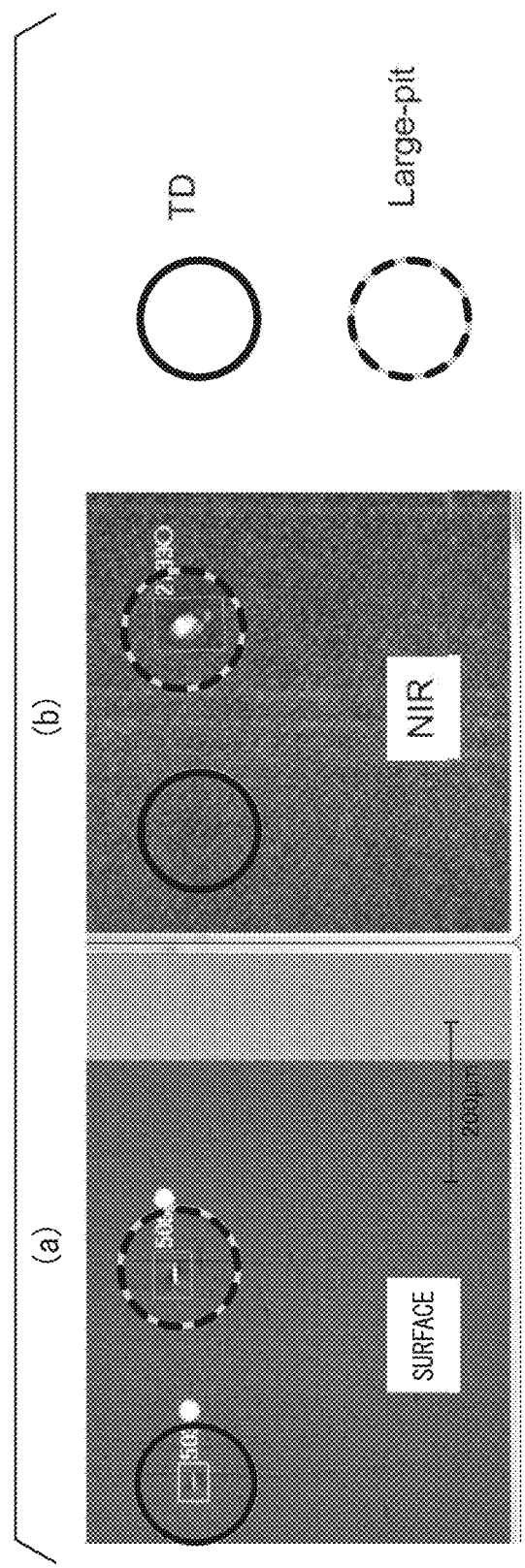
FIG. 14 (a) shows a SICA image in the vicinity of a large pit defect (Large-pit) caused by a substrate carbon inclusion on the surface of a SiC epitaxial wafer and in the vicinity of a defect originating from a threading dislocation (TD) in the substrate, and FIG. 14 (b) shows a PL image thereof.

FIG. 12 shows a SICA image in the vicinity of a large pit defect caused by a substrate carbon inclusion on the surface of a SiC epitaxial wafer on the left side (surface), and a PL image thereof which is obtained at a light-receiving wavelength of a bandpass (630 to 780 nm) using a near-infrared photoluminescence device (SICA 87 manufactured by Lasertec Corporation) on the right side (MR). For comparison, FIG. 13 shows a SICA image and PL image of a pit (defect) caused by a downfall on a single crystal substrate on the left side (surface) and on the right side (NW), respectively.

In the SICA images, both the large pit defect caused by the substrate carbon inclusion and the pit caused by the downfall are rounded and difficult to differentiate clearly. On the other hand, in the PL images, the pit caused by the downfall is in a round shape, whereas the large pit defects caused by the substrate carbon inclusions are often in the form of spider webs, and there is a clear distinction between them in this case.

It should be noted that even when a large pit defect caused by a substrate carbon inclusion in the PL image has a round shape, it is possible to differentiate from the pit originating from the downfall by comparing the positions of the carbon inclusions observed in the SICA images of the SiC single crystal substrate. Further, in the near-infrared photoluminescence device, when comparing the PL images of the large pit defect at a light-receiving wavelength of a bandpass of 400 to 678 nm or a bandpass of 370 to 388 nm, since the spider web portion appears black and the portion corresponding to the nucleus appears white, it can be distinguished from a pit caused by a downfall which appears the same as that in FIG. 13.

Defect Identification Method (Third Embodiment)

A defect identification method according to a third embodiment of the present invention is a method for identifying a defect in a SiC epitaxial layer in a SiC epitaxial wafer in which a SiC epitaxial layer is formed on a SiC single crystal substrate, and identifies a defect in the SiC epitaxial layer caused by a substrate carbon inclusion in the SiC single crystal substrate and a defect in the SiC epitaxial layer caused by a threading dislocation in the SiC single crystal substrate by using a confocal microscope having a confocal differential interference optical system and a near-infrared photoluminescence device.

FIG. 14(a) shows a SICA image in the vicinity of a large pit defect (Large-pit) caused by a substrate carbon inclusion on the surface of a SiC epitaxial wafer and a defect caused by a threading dislocation (TD) in the substrate, and FIG. 14(b) shows a PL image thereof which is obtained at the light-receiving wavelength of a bandpass (630 to 780 nm) using a near-infrared photoluminescence device (SICA 87 manufactured by Lasertec Corporation).

Although the large pit defect caused by the substrate carbon inclusion and the defect originating from the threading dislocation in the substrate have similar appearance in the SICA image of FIG. 14(a), in the PL image of FIG. 14(b), the defect originating from the threading dislocation in the substrate does not emit light, whereas the large pit defect appears in the form of a spider web and can be clearly distinguished.

INDUSTRIAL APPLICABILITY

The SiC epitaxial wafer and the production method thereof according to the present invention can be used, for example, as a SiC epitaxial wafer for a power semiconductor and as a production method thereof.

The invention claimed is:

1. A method for producing a SiC epitaxial wafer in which a SiC epitaxial layer is formed on a 4H—SiC single crystal substrate having an off angle and a substrate carbon inclusion density of 0.1 to 6.0 inclusions/cm$^2$, the method comprising:
   an epitaxial growth step of growing an epitaxial layer on the SiC single crystal substrate; and
   a selecting step of selecting a SiC epitaxial wafer which has a total density of large pit defects and triangular defects of 0.01 defects/cm$^2$ or more and 0.6 defects/cm$^2$ or less caused by substrate carbon inclusions and contained in the SiC epitaxial layer,
   wherein the substrate carbon inclusion in the 4H—SiC single crystal substrate is generated by incorporating a lump of carbon that came flying in the course of crystal formation into an ingot,
   a size of the large pit defect is from 100 to 500 μm$^2$,
   in the epitaxial growth step, a C/Si ratio is selected in response to the substrate carbon inclusion density,
   wherein in the epitaxial growth step, a growth rate is set from 5 to 100 μm/hour, a growth temperature is set to 1,500° C. or higher, and a C/Si ratio is set to 1.25 or less,
   wherein the large pit defect is a pit located on a surface at a position corresponding to a position of the carbon inclusion on the substrate surface, and
   wherein in the epitaxial growth step, a conversion rate from the substrate carbon inclusions to the large pit defects and the triangular defects caused by the substrate carbon inclusions is controlled to 20% or less by the C/Si ratio and a thickness of the SiC epitaxial layer.

2. The method for producing a SiC epitaxial wafer according to claim 1, wherein the C/Si ratio is set to 1.10 or less.

3. The method for producing a SiC epitaxial wafer according to claim 1, wherein the growth rate in the epitaxial growth step is 40 to 100 μm/hour.

4. The method for producing a SiC epitaxial wafer according to claim 1, wherein the growth rate in the epitaxial growth step is 60 to 100 μm/hour.

5. The method for producing a SiC epitaxial wafer according to claim 1, wherein in the epitaxial growth step, a conversion rate to the large pit defects and the triangular defects from the substrate carbon inclusions decreases as a thickness of the epitaxial layer increases.

6. The method for producing a SiC epitaxial wafer according to claim 1,
   wherein the C/Si ratio is increased in order to prioritize uniformity of impurities concentration, and
   wherein in the epitaxial growth step, a conversion rate to the large pit defects and the triangular defects from the substrate carbon inclusions is suppressed by increasing a thickness of the epitaxial layer.

* * * * *